United States Patent [19]

Ayasli

[11] 4,456,888
[45] Jun. 26, 1984

[54] RADIO FREQUENCY NETWORK HAVING PLURAL ELECTRICALLY INTERCONNECTED FIELD EFFECT TRANSISTOR CELLS

[75] Inventor: Yalcin Ayasli, Waltham, Mass.

[73] Assignee: Raytheon Company, Lexington, Mass.

[21] Appl. No.: 524,119

[22] Filed: Aug. 18, 1983

Related U.S. Application Data

[63] Continuation of Ser. No. 247,678, Mar. 26, 1981.

[51] Int. Cl.³ .............................................. H03F 3/60
[52] U.S. Cl. ..................................... 330/277; 330/286
[58] Field of Search ...................... 330/54, 277, 286; 333/204, 247

[56] References Cited

U.S. PATENT DOCUMENTS

| | | | |
|---|---|---|---|
| 3,495,183 | 2/1970 | Doundoulakis et al. | 330/277 X |
| 3,586,930 | 6/1971 | Das et al. | 317/235 R |
| 3,737,743 | 6/1973 | Goronein | 317/235 R |
| 3,790,825 | 2/1974 | Barron et al. | 307/304 |
| 4,016,643 | 4/1977 | Pucel et al. | 29/571 |
| 4,021,789 | 5/1977 | Furman et al. | 340/173 R |
| 4,065,782 | 12/1977 | Gray et al. | 357/23 |
| 4,070,690 | 1/1978 | Wickstrom | 357/68 |
| 4,107,720 | 8/1978 | Pucel et al. | 357/22 |
| 4,163,242 | 7/1979 | Stein | 357/41 |
| 4,291,286 | 9/1981 | Wagner | 333/166 |
| 4,311,966 | 1/1982 | Bert et al. | 330/54 X |

FOREIGN PATENT DOCUMENTS 1205087  9/1970  United Kingdom ................. 330/54

OTHER PUBLICATIONS

D'Yakonov et al., "Power MOSFET Amplifier with Subnanosecond Response Time", *Instrum. & Exp. Tech.*, (USA), vol. 23, No. 3, Pt. 2, May–Jun. 1980, Published Dec. 1980, pp. 679–681.
Lee, "MOSFETS Rejuvenate Old Design for CATV Broadband Amplifiers", *Electronics*, vol. 44, No. 6, Mar. 15, 1971, pp. 72–75.
McIver, "A Traveling-Wave Amplifier", *Proceedings of the IEEE*, Nov. 1965, pp. 1747–1748.
Electronic and Radio Engineering, Terman, McGraw-Hill, (1955), pp. 313–315.
"A MESFET Distributed Amplifier with 2 GHz Bandwidth", Proceedings of the IEEE, Jun. 1969.

*Primary Examiner*—James B. Mullins
*Attorney, Agent, or Firm*—Denis G. Maloney; Richard M. Sharkansky; Joseph D. Pannone

[57] ABSTRACT

A radio frequency network is provided having a plurality of field effect transistor cells, each one of such cells having a reactive element, and coupling means for electrically interconnecting the plurality of field effect transistor cells, such coupling means having an impedance in accordance with the reactance of the reactive elements of the cells to provide such radio frequency network with a predetermined characteristic impedance related to the impedance of an input circuit which feeds radio frequency energy to an input one of the plurality of cells. With such arrangement the coupling means and the plurality of field effect transistor cells provide the radio frequency network with a predetermined characteristic impedance which is related to the impedance of the input circuit.

22 Claims, 17 Drawing Figures

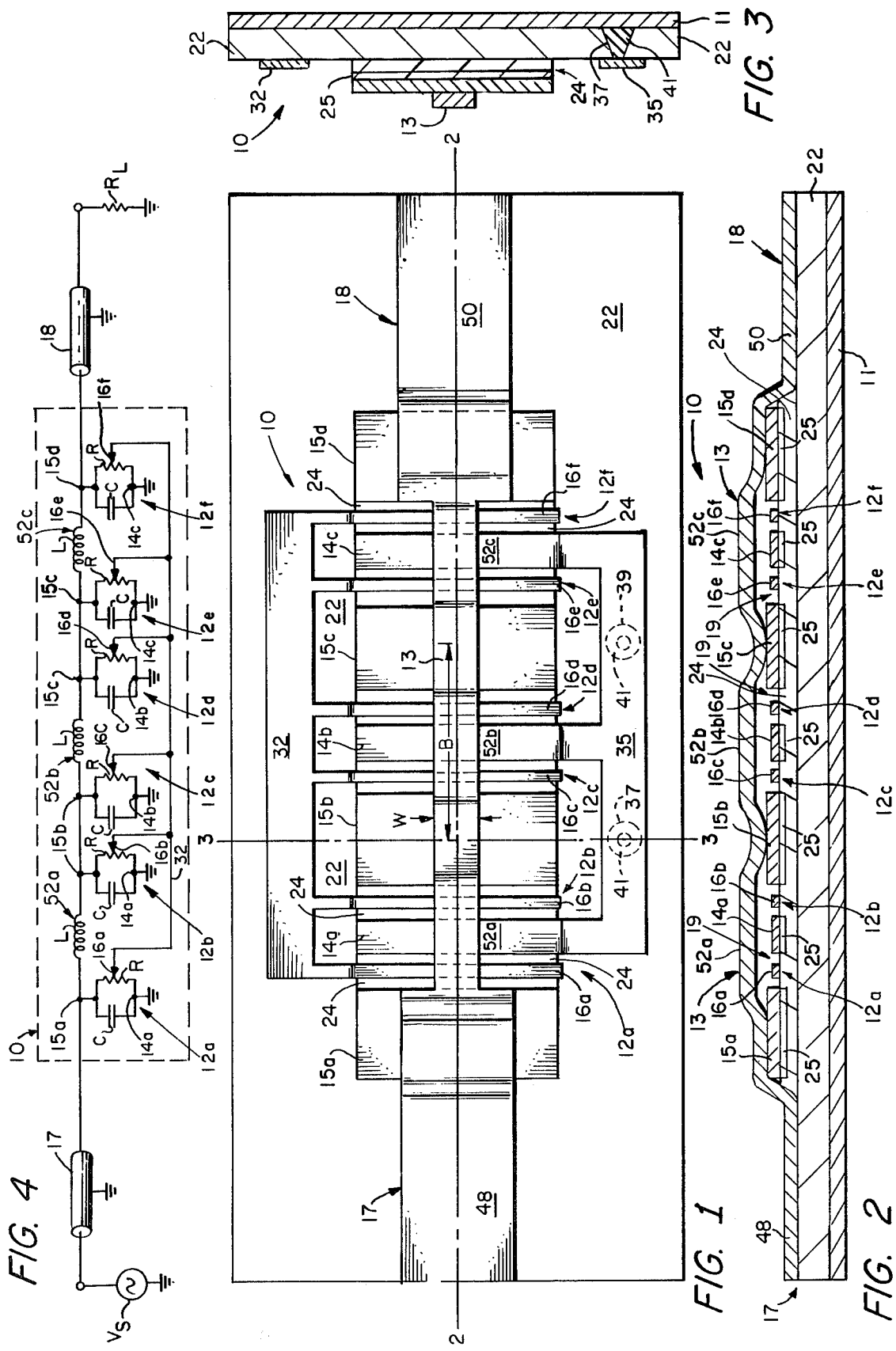

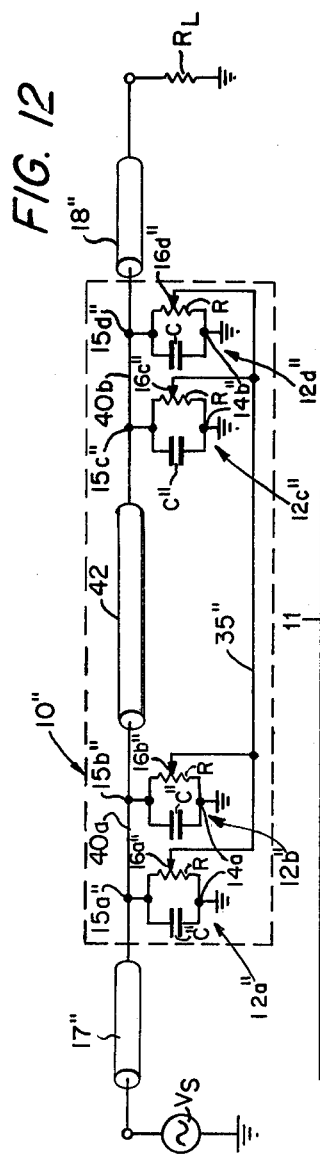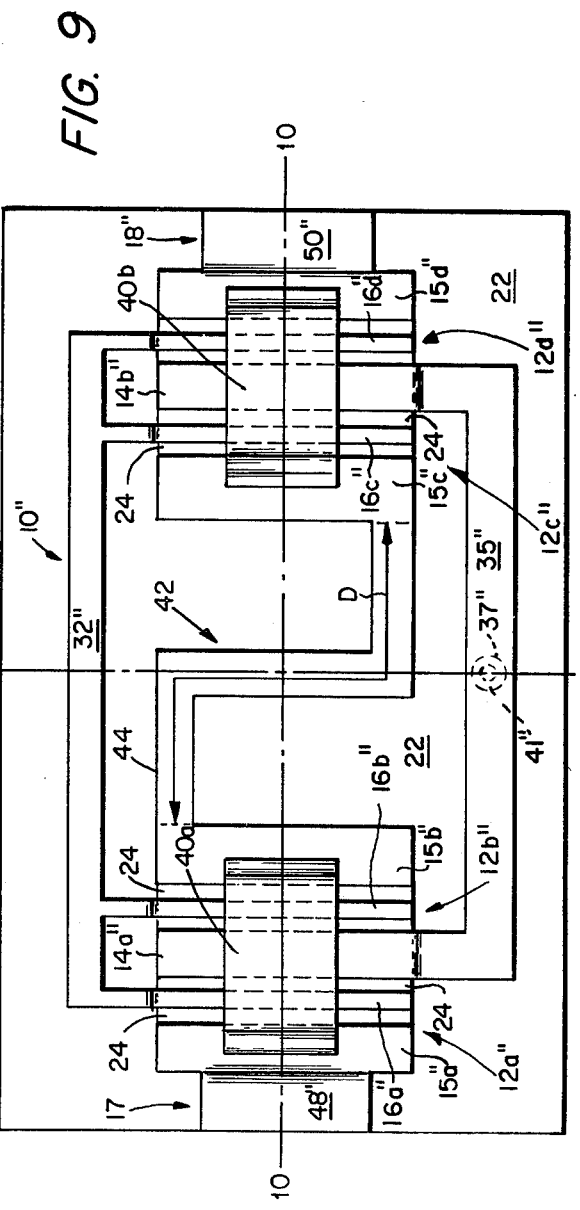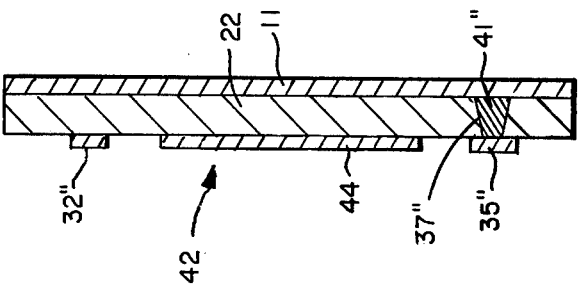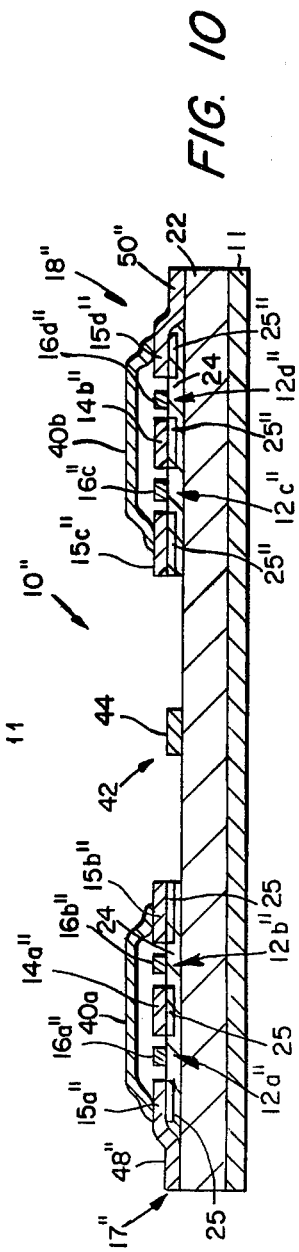

RADIO FREQUENCY NETWORK HAVING PLURAL ELECTRICALLY INTERCONNECTED FIELD EFFECT TRANSISTOR CELLS

This application is a continuation of application Ser. No. 247,678 filed Mar. 26, 1981.

BACKGROUND OF THE INVENTION

This invention relates generally to radio frequency networks which include field effect transistors and more particularly to radio frequency networks which include field effect transistors having a plurality of electrically interconnected cells.

As is known in the art, field effect transistors (FET) have been used in a wide range of applications. In many microwave applications it is sometimes desired to form a microwave transmission line and a field effect transistor on a common, semi-insulating gallium arsenide substrate. Generally, the microwave transmission line is a microstrip transmission line with the strip conductor and ground plane formed on upper and lower surfaces, respectively, of the semi-insulation substrate, such substrate providing the dielectric for the microstrip transmission line. To form the field effect transistor an active layer of gallium arsenide semiconductor material is generally formed over the upper surface of the substrate. This active layer may be formed epitaxially or by ion implantation techniques. When formed using epitaxy, a doped single crystal semiconductor layer is typically deposited on the semi-insulating substrate, usually with an intervening high resistivity epitaxial buffer layer to screen out diffusion impurities from the substrate during the active layer growth. With ion implantation, dopant atoms are implanted directly into the surface of a semi-insulating gallium arsenide substrate.

In one application the field effect transistor is used as a switch to electrically couple or decouple microwave energy source and a load selectively in accordance with a switching signal. In such application a microstrip transmission line is formed with the strip conductor of such transmission line extending laterally across a portion of the upper surface of the substrate. One end of the strip conductor provides an input port for coupling to the microwave source and the other end of the strip conductor provides an output port for coupling to the load. The field effect transistor is formed in a region of the upper surface of the active semiconductor layer adjacent the strip conductor and intermediate the input and output ports formed by the ends of the strip conductor. More particularly, the field effect transistor is formed with, for example, its drain electrode connected to the strip conductor at a point intermediate the ends of the strip conductor. The gate electrode is fed by a switching signal source. The source electrode is connected to the ground plane of the microstrip transmission line. In such application microwave energy fed by the microwave source is either allowed to pass the load or is reflected back to the microwave source selectively in accordance with the response of the field effect transistor to the switching signal fed to the gate electrode.

In high power applications it is sometimes necessary to provide a field effect transistor having a plurality of electrically interconnected cells. Here the active layer has formed on the upper surface thereof a plurality of source electrodes and a plurality of drain electrodes, such electrodes being disposed in alternating relationship laterally across the active layer in the region where the field effect transistor is formed. Disposed between each source electrode-drain electrode pair is a gate electrode. In the switching circuit application the gate electrodes are interconnected together at a common gate pad which is fed by a switching signal source, as described. Likewise, the drain electrodes are electrically interconnected to a common drain pad which is typically connected to the strip conductor at a point intermediate the ends thereof, as described. Finally, the source electrodes are interconnected together and to the ground plane conductor of the microstrip transmission line. In one interconnecting arrangement, for example, the source electrodes are interconnected by a metallization layer which overlays or bridges, in insulating relationship, the gate and drain electrodes, such bridging metallization layer having its ends terminating in a pair of contact pads on either side of the field effect transistor region. The contact pads are connected to the ground plane through via holes passing through the substrate and the active layer. In another interconnecting arrangement each one of the source electrodes is interconnected to the ground plane conductor through its own via hole which passes through a substrate. It is further known that reactive elements of the transistor, which are not inherent to the operation of the field effect transistor, limit the performance of the circuit. For example, associated with each field effect transistor is a capacitance $C_{ds}$ between each drain electrode and the grounded source electrode. Likewise, there is a capacitance $C_{gs}$ between each gate electrodes and the grounded source electrode. When a multiple cell field effect transistor is formed, however, the total effective drain-source capacitance is the parallel addition of the respective drain-source capacitances between the individual drain electrodes and the total effective gate source capacitance is the parallel addition of the respective gate-source capacitances. Consequently, in the switching arrangement described above, during the nonconducting state of the field effect transistor, as when it is desired that the field effect transistor acts as an open circuit so as to pass microwave energy from the microwave source to the load, these capacitances significantly reduce the impedance of the field effect transistor and thereby reduce its effectiveness. While it is at least theoretically possible to reduce the effect of these parasitic capacitances, as by forming an inductive element in parallel with them to thereby form a high impedance "tank" circuit, such compensation technique is generally only effective over a relatively narrow band of frequencies. Further, when the source electrodes are interconnected using the overlay metallization layer described above, in order to provide adequate separation between the source contact pads and the strip conductor a short conductor is generally used to interconnect the drain pad and the strip conductor. This short conductor, however, forms a small transmission line section which, during the conducting state of the field effect transistor, provides a reactive, frequency dependent element, thereby limiting the effective operating frequency bandwidth of the circuit.

SUMMARY OF THE INVENTION

In accordance with the present invention a radio frequency network is provided having: a plurality of field effect transistor cells, each one of such cells having a reactive element; and coupling means for electrically interconnecting the plurality of field effect transistor cells, such coupling means having an impedance in accordance with the reactance of the reactive elements of the cells to provide such radio frequency network with a predetermined characteristic impedance. With such arrangement the coupling means and the plurality of field effect transistor cells provide the radio frequency network with a predetermined characteristic impedance which is related to the impedance if an input circuit which feeds radio frequency energy to an input one of the plurality of interconnected cells.

In accordance with a first feature of the invention, the radio frequency network is configured as an artificial line with the coupling means and the reactive elements providing series and shunt elements, respectively, of the artificial line. The reactance of the coupling means is selected in accordance with the reactance of the reactive elements to provide such artificial line with a characteristic impedance related to the characteristic impedance of the input circuit. In accordance with a second feature of the invention, the coupling means is a radio frequency transmission line having a characteristic impedance, $Z_L$, selected in accordance with the reactance of the reactive elements to provide the radio frequency network with a characteristic impedance related to the characteristic impedance of the input circuit. With either one of these arrangements, the coupling means, in addition to providing an electrical interconnect for like ones of the source, drain and gate electrodes of the plurality of transistor cells, is configured in accordance with the reactance of the inherent reactive elements of the field effect transistor cells, for example, to provide a radio frequency network having a characteristic impedance substantially matched to the impedance of the input circuit over a relatively wide bandwidth.

In a preferred embodiment of the invention, and in accordance with the first feature of the invention, first like ones of the source, drain and gate electrodes of the plurality of transistor cells are coupled to a predetermined reference potential, typically ground potential. The coupling means is configured to provide a lumped inductor between interconnected ones of a second like one of the electrodes, such lumped inductors providing the serially connected inductors for the artificial line. Inherent capacitances produced between the grounded first like ones of the electrodes and the second like ones of the electrodes provide the lumped, shunt connected capacitors for the artificial line. The field effect transistor, and hence the artificial line, is serially connected between a pair of microstrip transmission lines, one thereof being fed by a microwave source and the other one thereof feeding a load. The inductance of the coupling means is selected so that the ratio of the inductive reactance of the coupling means to the capacitive reactance of the reactive elements is related to the characteristic impedances of the pair of microstrip transmission lines. With such arrangement, in addition to the coupling means providing an interconnecting structure for like electrodes of the transistor cells, such coupling means provides lumped inductive elements of an artificial line and, therefore, additionally compensates for inherent reactive elements of the field effect transistor cells with the result that a microwave circuit is provided adapted to operative over a relatively wide bandwidth.

In a second preferred embodiment, and in accordance with the second feature of the invention, the coupling means is a radio frequency transmission line. Such embodiment is particularly useful where, in the embodiment described above, for example, physical constraints limit the amount of inductance obtainable with the coupling means. In accordance with the second preferred embodiment, the radio frequency transmission line provides the electrical interconnect for the like electrodes of the transistor cells and has its characteristic impedance and length selected to compensate for the inherent capacitances of the transistor cells by providing, together with the inherent capacitances of the field effect transistor cells, a radio frequency network having a characteristic impedance related to, preferably substantially matched to, the characteristic impedance of input and output transmission lines over a relatively wide band of frequencies.

BRIEF DESCRIPTION OF THE DRAWINGS

FIG. 1 is a diagrammatical plan view of a radio frequency network having a plurality of electrically interconnected field effect transistor cells according to the invention;

FIG. 2 is a cross-sectional view of the network of FIG. 1 such section being taken along line 2—2 of FIG. 1;

FIG. 3 is a cross-sectional view of the network of FIG. 1, such section being taken along line 3—3 of FIG. 1;

FIG. 4 is an equivalent circuit of the network of FIG. 1;

FIG. 9 is a diagrammatical plan view of a radio frequency network having a plurality of electrically interconnected field effect transistor cells according to a second alternative embodiment of the invention;

FIG. 10 is a cross-sectional view of the network of FIG. 9, such section being taken along line 10—10 of FIG. 9;

FIG. 11 is a cross-sectional view of the network of FIG. 9, such section being taken along line 11—11 of FIG. 9;

FIG. 12 is an equivalent circuit of the network of FIG. 9;

DESCRIPTION OF THE PREFERRED EMBODIMENTS

Figure 7:
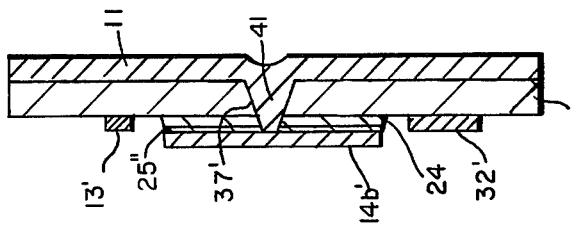
FIG. 7 is a cross-sectional view of the network of FIG. 5, such section being taken along line 7—7 of FIG. 5.

Referring now to FIGS. 1, 2 and 3, a microwave network 10 is shown to include a plurality of, here six, field effect transistor cells 12a-12f, and a coupling means, here a metallization layer 13, for electrically interconnecting a like one of the source electrodes 14a-14c, drain electrodes 15a-15d and gate electrodes 16a-16f, here for electrically interconnecting the drain electrodes 15a-15d, as shown. In this way, the microwave network 10 includes a series of cascade connected field effect transistor cells 12a-12f, as will be discussed in detail hereinafter. Sufficient to say here that the metallization layer 13 is dimensionally configured to have an impedance selected in accordance with the reactance of inherent reactive elements of the transistor cells 12a-12f, (here the capacitances between the source and drain electrodes of the transistor cells 12a-12f) to provide the microwave network 10 with a characteristic impedance $Z_n$ related to, here preferably substantially equal to, the characteristic impedance $Z_o$ of an input circuit 17 which feeds microwave energy to the microwave network 10 and an output circuit 18. The microwave network 10, together with the input circuit 17 and an output circuit 18 are formed on a dielectric substrate 22, here a semi-insulating gallium arsenide substrate having a resistivity of $10^7$ ohm-cm. A ground plane conductor 11 is formed on the bottom surface of the substrate 22, as shown. An active semiconductor region 24 is formed on the upper surface of the substrate 22, as shown. Formed in the semiconductor active layer 24 is the plurality of field effect transistor cells 12a-12f. The active semiconductor region 24 is here an n-type conductive layer of epitaxially grown gallium arsenide, here having a doping concentration of $10^{17}$ electrons/cm$^3$. Formed in ohmic contact with n+ type conductivity contact regions 25 is the plurality of drain electrodes 15a-15d and the plurality of source electrodes 14a-14c. The contact regions 25 here have a doping concentration of $10^{18}$ electrons/cm$^3$ and are formed from a second, epitaxially grown layer. Alternatively, such contact regions 25 may be found ion implanting into selected regions of the epitaxial layer 24. Disposed between each of the pairs of the source drain electrodes 15a-15c, 14a-14c are the gate electrodes 16a-16f, as shown. Each one of the gate electrodes 16a-16f is formed in a conventional manner as a rectifying metal-semiconductor junction or a Schottky junction with the active epitaxial layer 24 thereby forming the plurality of six single gate transistor cells 12a-12f, each one of the transistor cells being here a depletion mode device. The gate electrodes 16a-16f extend beyond the epitaxial layer 24 and onto the upper surface of the substrate 22 where they are electrically interconnected by a common gate pad 32, as shown. Likewise, the source electrodes 14a-14c extend beyond the epitaxial layer 24 and onto the upper surface of the substrate 22 where they are electrically interconnected by a common source pad 35, as shown. The source pad 35 is electrically connected to the ground plane conductor 11 by providing a pair of via holes 37, 39 with conductive material 41 passing therethrough, as shown in FIG. 3. The drain electrodes 15a-15d are interconnected by the metallization layer 13 which overlays or bridges the gate electrodes 16a-16f and the source electrodes 14a-14c, as shown. It is noted that the source electrodes 14a-14c and gate electrodes 16a-16f are separated from layer 13 by air regions 19, as shown. The input and output circuits 17, 18 are here a pair of microstrip transmission line circuits. The input and output microstrip transmission circuits 17, 18 include strip conductors 48, 50 (which are integrally formed with metallization layer 13) and the ground plane conductor 11 with the dielectric separation being provided by the portions of substrate 22 disposed therebetween. Thus, the dimensions of the microstrip transmission line 17 formed by strip conductor 48 and the thickness of the semiinsulating, dielectric substrate 22 are selected to provide microstrip transmission line 17 with a predetermined characteristic impedance, $Z_o$, here 50 ohms. Likewise, microstrip transmission line 18 is designed in a similar manner to provide a predetermined characteristic impedance, $Z_o$, here also 50 ohms. It is here noted that the metallization layer 13 interconnecting the drain electrodes 15a-15d is configured in width (W), lengths (B) and thickness to provide lumped inductors between interconnected pairs of the drain electrodes 15a-15d which, together with inherent lumped capacitance elements (to be described) of the field effect transistor cells 12a-12f, form the microwave network 10 as an artificial line having a predetermined characteristic impedance $Z_n$. Here such characteristic impedance, $Z_n$, is preferably matched (or equal) to the characteristic impedances $Z_o$ of the microstrip transmission lines 17, 18. That is, the microwave network 10 is an artificial line having a characteristic impedance $Z_n$, here preferably 50 ohms, made up of the cascade connected field effect transistor cells 12a-12f, such transistor cells being connected in cascade by the metallization layer 13; such metallization layer providing series lumped inductors for the artificial line while the lumped shunt capacitors for the artificial line are provided by the inherent capacitance between the drain and source electrodes.

Referring now to FIG. 4, an equivalent circuit of the microwave network 10 shown in FIGS. 1-3 is shown as an artificial line. The overlay metallization layer 13 (FIGS. 1, 2 and 3) is shown as a series of lumped inductors L and the inherent capacitive elements between the source and drain electrodes of the field effect transistor cells 12a-12f being shown as a shunt capacitive element, C. The capacitor C represents the inherent, shunt-connected capacitance between each one of the drain electrodes 15a-15d and the adjacent one of the grounded source electrodes 14a-14c. The serially connected inductors L represent the lumped inductances formed by the portions 52a, 52b, 52c of the overlayed metallization layer 13 disposed between adjacent pairs of interconnected drain electrodes 15a, 15b; 15b, 15c; and 15c, 15d, respectively. It is noted that the microwave network 10 has a characteristic impedance $Z_n$ which may be approximated as $\sqrt{L/2C}$, independent of frequency if the length (B) of the overlay metallization layer 13 is small compared to the shortest operating wavelength of the network 10. Therefore, by dimensionally configuring the drain electrode interconnecting metallization layer 13 in accordance with the reactance (here the source-drain capacitance) of the inherent reactive element of the field effect transistor cells 12a-12f the network 10 is formed as an artificial line having a characteristic impedance $Z_n$ related to, and here preferably equal to, the characteristic impedance, $Z_o$, of microstrip transmission lines 17, 18 (i.e. $Z_n \approx Z_o$) over an extremely wide range of frequencies. Thus, in operation, a source of radio frequency energy $V_s$ is fed to the microstrip transmission line 17. When the control signal fed to the gate pad 32 biases the field effect transistor cells 12a–12f to the nonconducting state (so that a relatively high resistance (represented by the variable resistors R in FIG. 4) is provided to carriers in the active semiconductor layer 24 passing between the source and drain electrodes thereof) the radio frequency fed input microstrip transmission line 17 passes through the such artificial line (i.e. network 10) and then to a load $R_L$ connected to output transmission line 18. To provide maximum power transfer to the load, the microstrip transmission lines 17, 18 and the network 10, together with the load, all have the same impedance, $Z_o$, here 50 ohms. Therefore, by proper selection of the thickness, width and length of the metallization layer 13 and by proper selection of the size of the periphery and spacing of the drain, gate and source electrodes of the transistor cells 12a–12f, the network 10 has an impedance $Z_n$ preferably matched to the characteristic impedance of the other microwave circuitry also formed on the same substrate 22. When the control signal fed to the gate pad 32 biases the field effect transistor cells 12a–12f to the conducting state (so that a relatively low resistance, R, is presented to carriers passing between the source and drain electrodes thereof) the network 10 acts as a "short circuit" to ground and the radio frequency energy from source $V_S$ is reflected back to such source so that the network acts as a switch in the off position to inhibit a flow of energy from the source $V_S$ to the load $R_L$.

Figure 8:
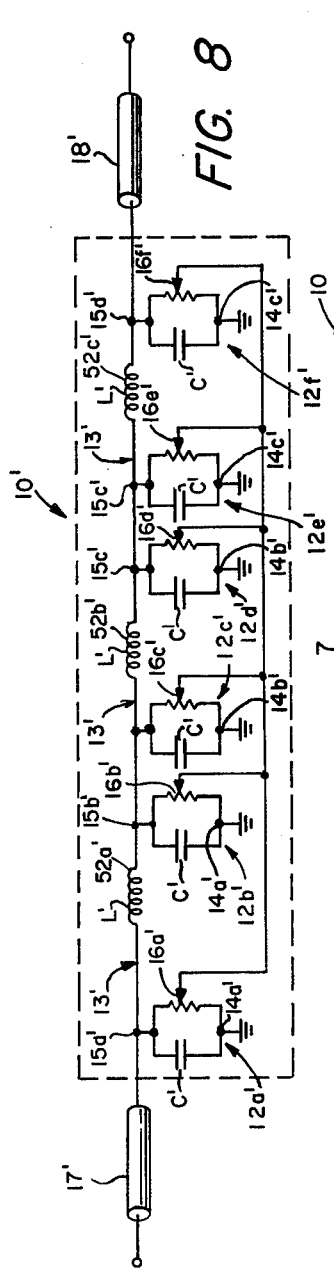
FIG. 8 is an equivalent circuit of the network of FIG. 5.
Figure 5:
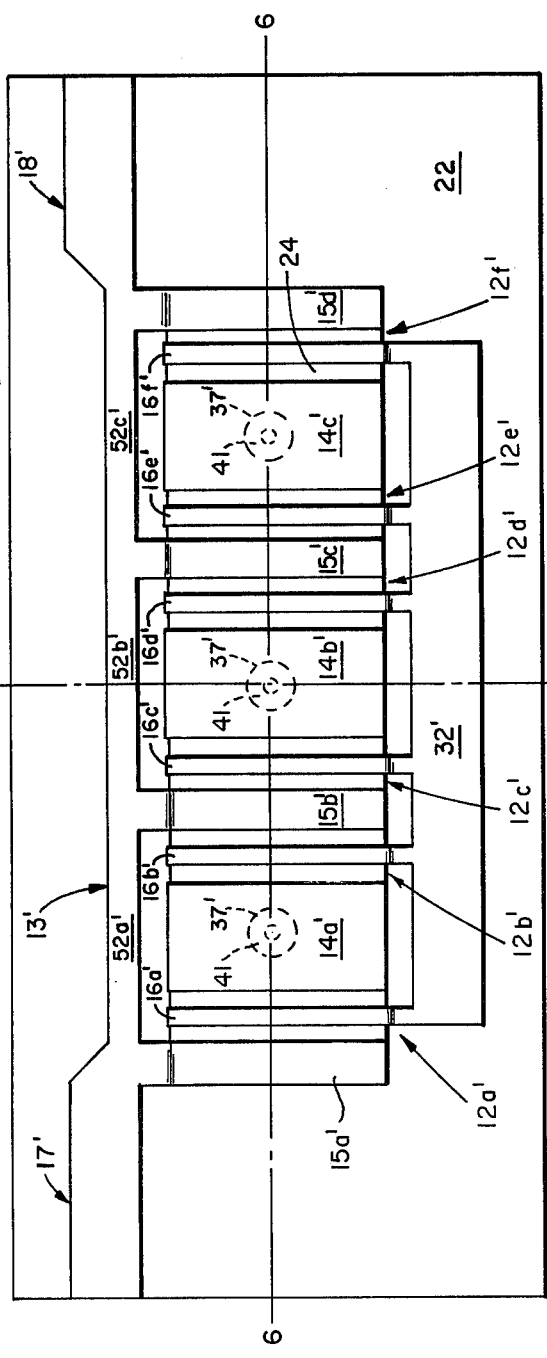
FIG. 5 is a diagrammatical plan view of a radio frequency network having a plurality of electrically interconnected field effect transistor cells according to a first alternative embodiment of the invention.
Figure 6:
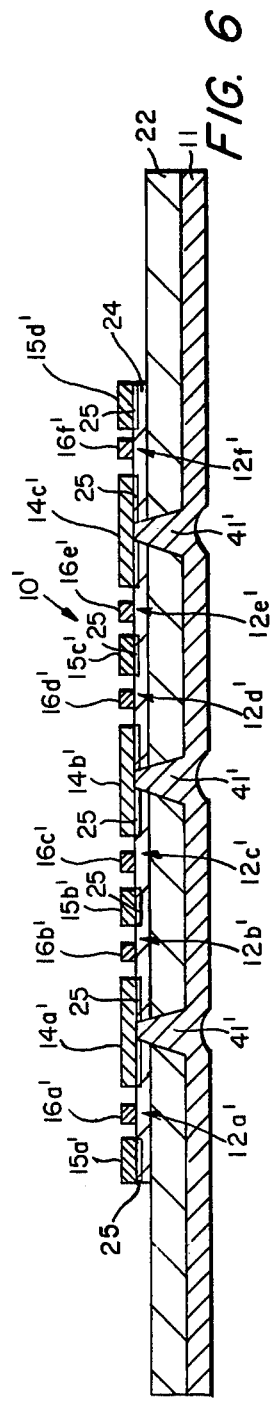
FIG. 6 is a cross-sectional view of the network of FIG. 5, such section being taken along line 6—6 of FIG. 5.

Referring now to FIGS. 5, 6 and 7, an alternative embodiment is shown wherein a microwave network 10' includes a plurality of field effect transistor cells 12a'–12f' with source electrodes 14a', 14b' and 14c' connected to ground plane conductor 11 by conductors 41, passing through via holes 37' formed through gallium arsenide substrate 22 and epitaxial layer 24, as shown. Here, however, the drain electrodes 15a', 15b', 15c' and 15d' are electrically interconnected through interconnecting or coupling structure 13' formed over the surface of the substrate 22, as shown. Each one of the transistor cells 12'a–12'f includes a corresponding one of the gate electrodes 16'a–16'f, such gate electrodes being interconnected to gate pad 32', as shown. It is noted that the length, width and thickness of the interconnecting structure 13' are selected to provide lumped inductors L' (FIG. 8) between the drain electrodes 15a', 15b', 15c' and 15d' and thereby, together with the inherent capacitances C' produced between connected pairs of the drain electrodes 15a'–15d' and the adjacent ground source electrodes 14a'–14c', form such network 10' as an artificial line as shown in FIG. 8. Here the portions 52a', 52b' and 52c' of interconnecting metallization layer 13' which are used to electrically interconnect the pairs of drain electrodes 15a', 15b'; 15b', 15c'; 15c' and 15d' are dimensionally configured to approximate the lumped inductors, L'. The value of the inductance L' is selected so that the characteristic impedance of the network 10 (and hence the artificial line), $Z_n$, is approximately equal to $\sqrt{L'/2C}$ and is related to, here preferably, the same as, the characteristic impedance $Z_o$ of the pair of strip transmission lines 17', 18', here 50 ohms (i.e. $Z_n \approx Z_o = 50$ ohms).

Referring now to FIGS. 9, 10 and 11, a microwave network 10" is shown to include a plurality of field effect transistor cells 12a"–12d" disposed between a pair of microstrip transmission lines 17", 18". The cells 12a'–12d" are formed in the epitaxial layer 24 disposed over a single gallium arsenide substrate 22. Here the plurality of transistor cells 12a" to 12d" have drain electrodes 15a" to 15d" in ohmic contact with contact region 25 of the gallium arsenide epitaxial layer 24, with the drain electrodes 15a" and 15d" being integrally formed with end portions of strip conductors 48", 50" of microstrip transmission lines 17", 18", as shown. Drain electrodes 15a" and 15d" are electrically connected to drain electrodes 15b" and 15c" by conductors 40a, 40b, respectively, as shown. It is noted that here conductors 40a, 40b are relatively short and have negligible inductances in comparison to a microstrip transmission line 42 used to electrically interconnect drain electrode 15b" to drain electrode 15c". The microstrip transmission line 42 here includes a strip conductor 44 which is formed over a portion of the surface of substrate 22 as shown. The ground plane for such strip transmission line 42 is provided by a ground plane conductor 11 formed over the bottom surface of the substrate 22, as shown. The source electrodes 14a", 14b" of the field effect transistor cells 12a"–12d" are electrically connected to a source pad 35" which is electrically connected to the ground plane conductor 11 through conductor 41' which pass through via hole 37", as shown. Gate electrodes 16a", 16b", 16c" and 16d" are disposed between pairs of source-drain electrodes, as shown; such gate electrodes 16a'–16d" being electrically interconnected by gate pad 32", as shown.

The equivalent circuit for the microwave network 10" is shown in FIG. 12 where C" represents the inherent capacitance between each one of the drain electrodes 15a"–15d" and the adjacent one of the ground source electrodes 14a", 14b". The resistances between the source and drain electrodes in the active layer 24 are represented by variable resistors, R, the resistances of which are controlled by a control signal fed to gate electrodes 16a"–16d" via pad 32". The microstrip transmission line 42 is configured to have a characteristic impedance $Z_L = \sqrt{L_L/C_L}$, where $L_L$ is the distributed, series per unit length inductance of the strip transmission line 42 and $C_L$ is the distributed, shunt per unit length capacitance of the microstrip transmission line. Microstrip transmission line 42 is selected so that the characteristic impedance of the network 10" $Z_n$ is related to, here preferably equal to, the characteristic impedance of the strip transmission lines 17", 18", i.e. $Z_o$, here 50 ohms. That is, here the characteristic impedance of the network 10" is approximately $Z_n = \sqrt{L_L/(C_L + 2(C''/D))}$, where D is the length of the microstrip transmission line 42 as shown in FIG. 9 and C" is the capacitance between one of the source electrodes 15a"–15d" and the adjacent one of the ground drain electrodes 14a", 14b". Thus, the microstrip transmission line 42 is here configured with characteristic impedance $Z_L$ such that the characteristic impedance of network 10", $Z_n$, is related to, here preferably equal to, the characteristic impedance $Z_o$ of each of the transmission lines 17", 18" and is also substantially equal to the impedance of the load $R_L$ (i.e. $Z_n \approx Z_o$).

Figure 15:
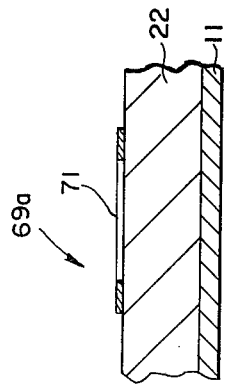
FIG. 15 is a cross-sectional view of a portion of one of the radio frequency networks used in the amplifier of FIG. 13, such section being taken along line 15—15 of FIG. 13.
Figure 14:
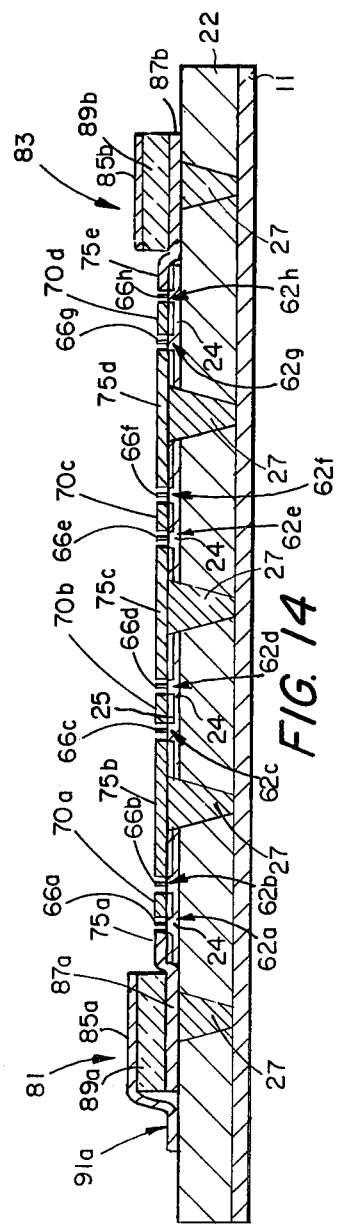
FIG. 14 is a cross-sectional view of the amplifier of FIG. 13, such section being taken along line 14—14 of FIG. 13.
Figure 13:
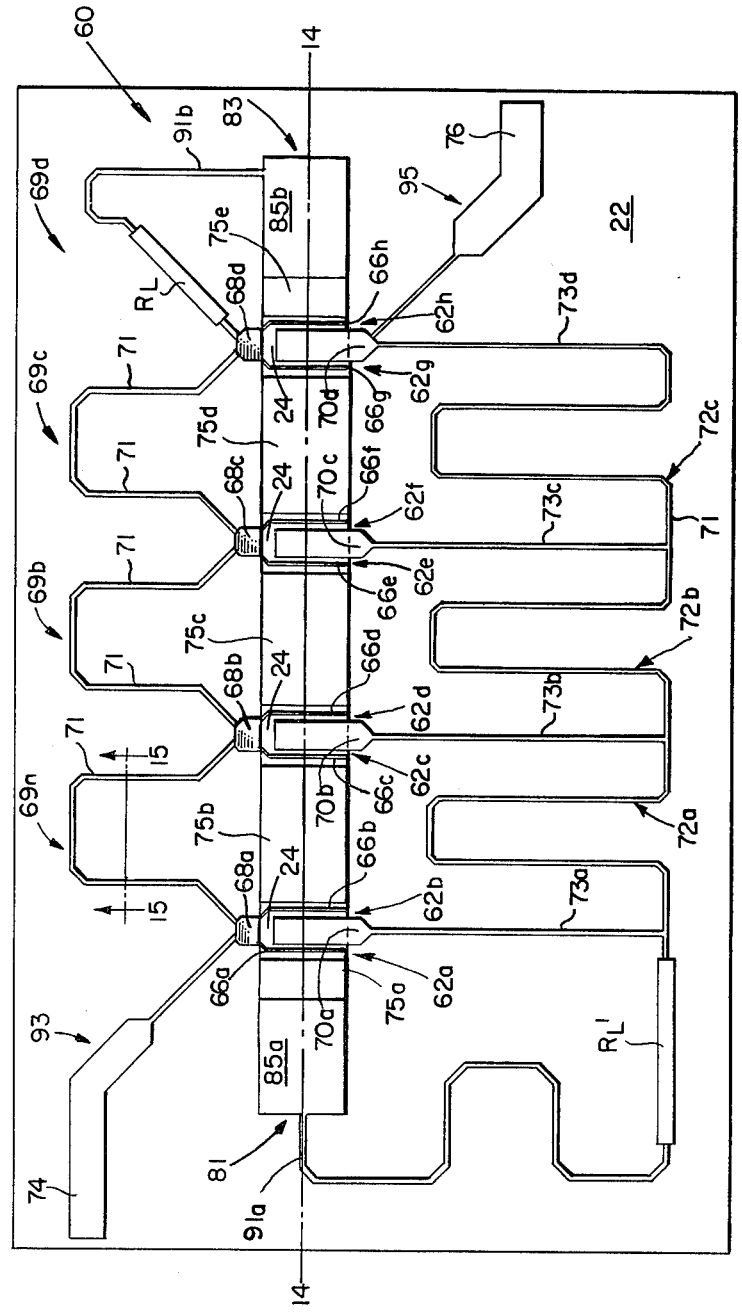
FIG. 13 is a diagrammatical plan view of a distributed amplifier having a pair of radio frequency networks according to the invention.
Figure 16:
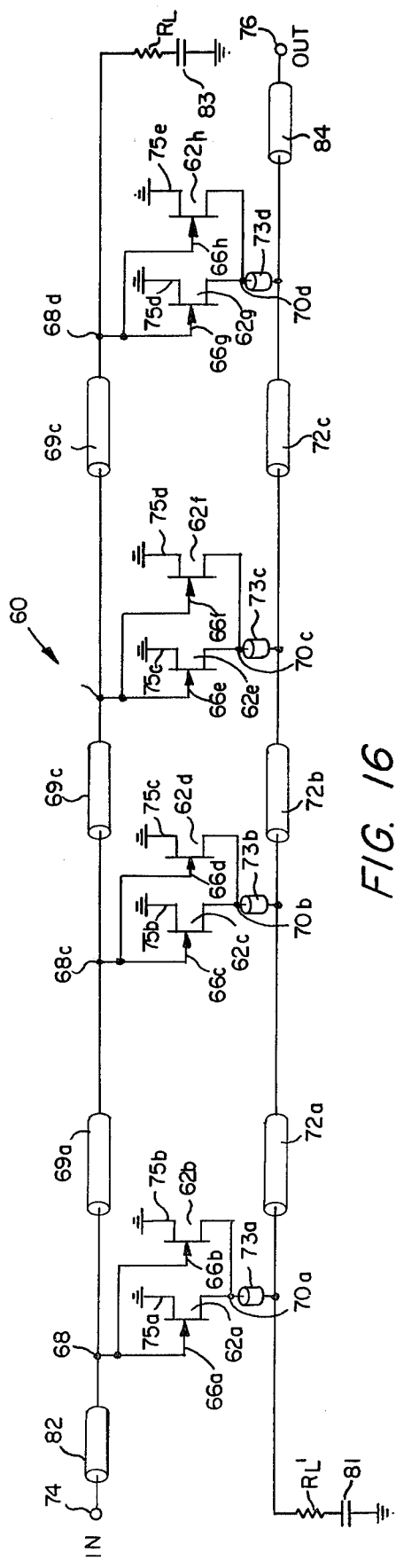
FIG. 16 is a schematic diagram of the amplifier of FIG. 13.
Figure 17:
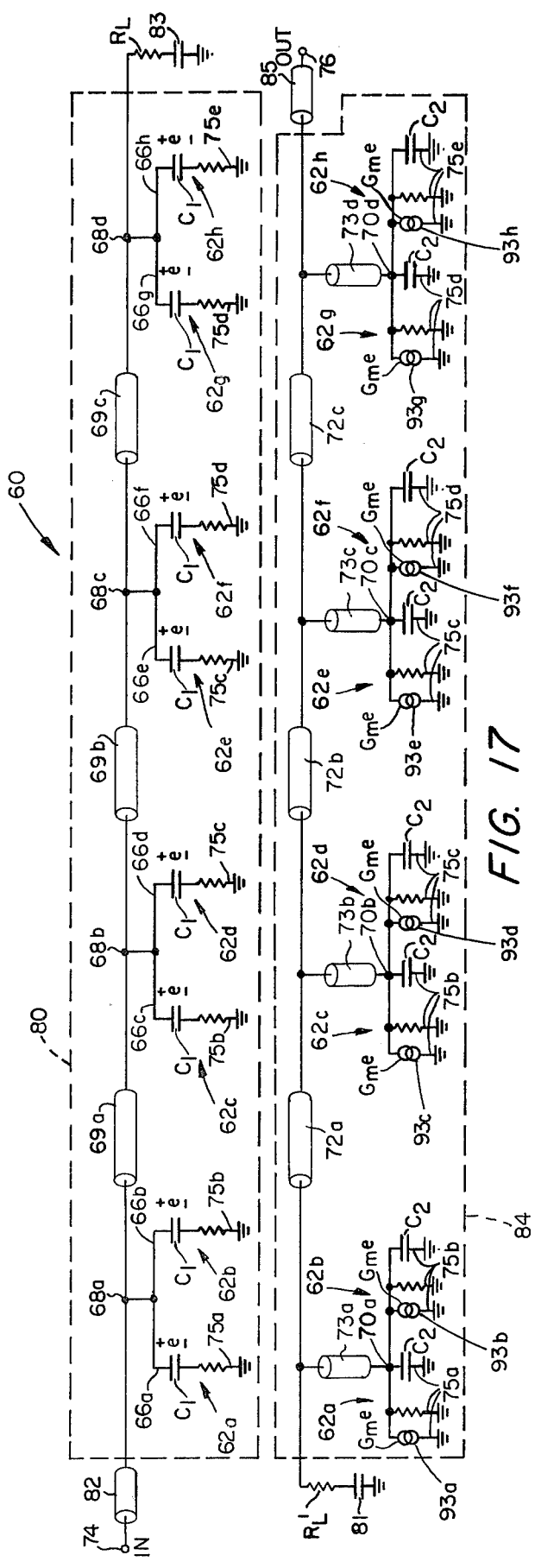
FIG. 17 is an equivalent circuit of the amplifier of FIG. 13.

Referring now to FIGS. 13 and 14, a distributed amplifier 60 according to the invention is shown to include a plurality of, here eight, field effect transistor cells 62a–62h. Pairs of gate electrodes 66a–66h are electrically connected to to contact pads 68a–68d, as shown. The gate pads 68a–68d are electrically cascade connected by microstrip transmission lines 69a–69c as shown, a portion of line 69a being shown in FIG. 15. The drain electrodes 70a–70d are electrically cascade interconnected by microstrip transmission lines 72a–72c, and microstrip transmission lines 73a–73d, as shown. A plurality of, here five, source electrodes 75a–75e are provided. Source electrodes 75b–75d are connected to ground plane conductor 11 by providing conductors 27 passing through the active layer 24 and substrate 22, as shown in FIG. 14. Gate electrodes 75a, 75e are connected to ground plane conductor 11 by conductor 27' passing through substrate 22, as shown. The plurality of field effect transistor cells 62a–62h and are formed in active layer 24 and microstrip transmission lines 69a–69c, 72a–72c and 73a–73d are formed with the gallium arsenide semi-insulating substrate 22 providing the dielectric between the ground plane conductor 11 and the strip conductors of such microstrip transmission lines. Here the source electrodes 75a–75e are connected to ground plane conductor 11 which is formed on the bottom surface of substrate 22 through via holes, as shown. A pair of d.c. blocking capacitors 81, 83 are used to block direct current in biasing circuitry (not shown) and include pairs of electrodes 85a, 85b and 87a, 87b separated by suitable dielectric layers 89a, 89b, as shown. The upper electrodes 85a, 85b are connected to the load resistors $R_L'$, $R_L$ respectively, here thin film resistors, and through microstrip transmission lines 91a, 91b, respectively, and the bottom electrodes 87a, 87b are connected to the source electrodes 75a, 75e and hence to ground plane conductor 11 by conductors 27' passing through via holes formed through the substrate 22 as shown in FIG. 14. In operation, a microwave signal is coupled to input terminal 74 of microstrip transmission line 93 and propagates from gate electrode pad 68a successively in cascade fashion, to gate electrode pads 68b, 68c, and 68d through microstrip transmission lines 69a, 69b, 69c, respectively. It is noted that microstrip transmission line 69c in addition to being connected to gate electrode pad 68d is connected to a resistive load $R_L$, here 50 ohms. The resistive load $R_L$ is connected to ground through dc blocking capacitor 83 as described. A schematic circuit for the amplifier 60 is shown in FIG. 16 and an equivalent circuit for such amplifier 60 is shown in FIG. 17. It is noted that each of the cells 62a–62h includes a current source 93a–93h which provides an amount of current equal to $G_m e$ where $G_m$ is the transconductance of the cell and e is the voltage across the input gate-source capacitance $C_1$ of such cell. In response to the microwave energy fed to the input 74 microwave signals are produced at the drain electrodes 70a–70d. The drain electrode 70a in addition to being coupled to microstrip transmission lines 72a, 73a is connected via line 73a to a resistive load $R_L'$ which is connected via line 91a to the ground plane conductor 11 through dc blocking capacitor 81. The drain electrode 70d is connected to an output terminal 76 of microstrip transmission line 95. The electrical pathlengths from the input 74 to the output 76 through each one of the field effect transistor cells 62a–62h are electrically equal. A drain voltage supply $V_{dd}$ (not shown) is coupled to output terminal 76 and biases each one of the field effect transistor cells 62a–62h to provide gain to the portion of the microwave signal fed to the gate pads 68a–68d. A gate bias voltage (not shown) is coupled to the input terminal 74. Further, the characteristic impedance of each one of the microstrip transmission lines 69a–69c is selected in accordance with the inherent capacitance $C_1$ between the gate electrodes 66a–66h and the grounded source electrodes 75a–75e to provide a microwave network 80 (FIG. 17) with a characteristic impedance $Z_n$ related to, here preferably substantially equal to, the characteristic impedance $Z_o$ of an input microstrip transmission line 93, here 50 ohms. Likewise, the characteristic impedance of the microstrip transmission lines 72a–72c and microstrip transmission lines 73a–73d are selected in accordance with the inherent capacitances $C_2$ between the drain electrodes 70a–70d and the grounded source electrodes 75a–75e to provide a microwave network 84 (FIG. 17) with a characteristic impedance $Z_n$ related to, here also substantially equal to, the characteristic impedance $Z_o$ of an output microstrip transmission line 95, here 50 ohms.

Having described preferred embodiments of the invention it will now be apparent to one of skill in the art that other embodiments incorporating its concept may be used. It is believed therefore that this invention should not be restricted to the disclosed embodiment but rather should be limited only by the spirit and scope of the appended claims.

What is claimed is:

1. A radio frequency network, having an input terminal and an output terminal, for electrically coupling or decoupling radio frequency energy fed to the input terminal between such input terminal and the output terminal selectively in accordance with a control signal, comprising:
    (a) a plurality of transistor cells, each one of such cells having a reactive element, a control electrode fed by the control signal, and first and second electrodes;
    (b) a coupling means, having a first end connected to the input terminal, and having a second end connected to the output terminal, for electrically interconnecting the first electrodes of the plurality of transistor cells between the input terminal and output terminal, such coupling means having an impedance in accordance with the impedance of the reactive elements of the cells to provide such radio frequency network with a predetermined characteristic impedance; and
    (c) wherein in response to a first state of the control signal, such control signal biases such cells to provide a relatively low resistance between the first and second electrodes of the cells to decouple the radio frequency energy, and in response to a second state of the control signal, such control signal biases such cells to provide a relatively high resistance between the first and second electrodes of the cells to couple the radio frequency energy.

2. The radio frequency network recited in claim 1 wherein the coupling means and the reactive elements provide series and shunt elements, respectively, of an artificial line.

3. The radio frequency network recited in claim 1 wherein the coupling means includes a radio frequency transmission line having a characteristic impedance in accordance with the impedance of the reactive elements to provide the radio frequency network with the predetermined characteristic impedance.

4. The radio frequency network as recited in claim 1 wherein the transistor cells are field effect transistors, the input electrode is a gate electrode, and the output electrode is a first one of a drain and source electrode of the field effect transistor.

5. A radio frequency network having an input terminal and an output terminal for electrically coupling or decoupling radio frequency energy between such input terminal and such output terminal selectively in accordance with a control signal comprising:

(a) a radio frequency transmission line having a predetermined characteristic impedance, a first end adapted for electrical connection to a source of such radio frequency energy, and a second end electrically connected to the input terminal to feed radio frequency energy to the input terminal;

(b) a plurality of field effect transistor cells, each one of such cells having a reactive element and source, drain and gate electrodes, with each gate electrode being fed by the control signal, and each first like one of the drain and source electrodes being coupled to a reference potential; and (c) a coupling means, having a first end connected to the input terminal and the second end of the radio frequency transmission line, and having a second end connected to the output terminal, for electrically cascade interconnecting a second like one of such source and drain electrodes of the plurality of field effect transistor cells, between the input terminal and the output terminal such coupling means having an impedance in accordance with the impedance of the reactive elements of the cells to provide such radio frequency network with a predetermined characteristic impedance matched to the characteristic impedance of the radio frequency transmission line when radio frequency energy is coupled to the output terminal.

6. The radio frequency network recited in claim 5 wherein the coupling means and the reactive elements provide series and shunt elements, respectively, of an artificial line.

7. The radio frequency network recited in claim 5 wherein said transmission line is a first transmission line, and wherein the coupling means includes a second radio frequency transmission line having a characteristic impedance in accordance with the impedance of the reactive elements to provide the radio frequency network with the predetermined characteristic impedance.

8. A radio frequency network, having an input terminal and an output terminal, for electrically coupling or decoupling radio frequency energy between the input terminal and the output terminal selectively in accordance with a control signal comprising:

(a) a radio frequency transmission line having a predetermined characteristic impedance, a first end adapted for electrical connection to a source of such radio frequency energy, and a second end electrically connected to the input terminal to feed radio frequency energy to the input terminal;

(b) a plurality of field effect transistor cells, each one of such cells having a reactive element and source, drain and gate electrodes, the gate electrode of each one of the cells being electrically connected together at a first common conductor the common conductor being fed by the control signal, and a first like one of the source and drain electrodes of the cells being electrically connected together at a second common conductor;

(c) wherein in response to a first state of the control signal, such control signal biases such cells to provide a relatively low resistance between source and drain electrodes of the cells to decouple the radio frequency energy, and in response to a second state of the control signal, such control signal biases such cells to provide a relatively high resistance between source and drain electrodes of such cells to couple the radio frequency energy; and (d) a coupling means, having a first end connected to the input terminal, and having a second end connected to the output terminal, for electrically cascade interconnecting the plurality of field effect transistor cells between the input terminal and the output terminal, with a second like one of such source and drain electrodes of one of the cells being electrically connected to a like one of the source and drain electrodes of another one of the cells, such coupling means having an impedance selected in accordance with the impedance of the reactive elements of the cells to provide such radio frequency network with a predetermined characteristic impedance matched to the characteristic impedance of the radio frequency transmission line when such cells are in a relatively high impedance state and such radio frequency energy is coupled to the output terminal of the radio frequency network.

9. The radio frequency network recited in claim 8 wherein the coupling means and the reactive elements provide series and shunt elements, respectively, of an artificial line.

10. The radio frequency network recited in claim 8 wherein said transmission line is a first transmission line, and wherein the coupling means includes a second radio frequency transmission line having a characteristic impedance in accordance with the impedance of the reactive elements to provide the radio frequency network with the predetermined characteristic impedance.

11. A radio frequency network, having an input terminal and an output terminal, for electrically coupling or decoupling radio frequency energy between the input terminal and the output terminal selectively in accordance with a control signal, comprising:

(a) a plurality of field effect transistor cells, each one of such cells having a reactive element and source and drain electrodes, and a gate electrode being fed by the control signal;

(b) a coupling means, having a first end connected to the input terminal, and having a second end connected to the output terminal, for electrically interconnecting a first like one of such source and drain electrodes of the plurality of field effect transistor cells, between the input terminal and the output terminal, such coupling means having an impedance in accordance with the reactance of the reactive elements of the cells to provide such radio frequency network with a predetermined characteristic impedance related to the impedance of an input circuit electrically connected to the input terminal; and (c) wherein in response to a first state of the control signal, such control signal biases such cells to provide a relatively low resistance between source and drain electrodes of the cells to decouple the radio frequency energy, and in response to a second state of the control signal, such control signal biases such cells to provide a relatively high resistance between source and drain electrodes of such cells to couple the radio frequency energy.

12. The radio frequency network recited in claim 11 wherein the coupling means and the reactive elements provide series and shunt elements, respectively, of an artificial line.

13. The radio frequency network recited in claim 11 wherein the coupling means includes a radio frequency transmission line having a characteristic impedance in accordance with the impedance of the reactive elements to provide the radio frequency network with the predetermined characteristic impedance.

14. A radio frequency network having an input terminal and an output terminal, for electrically coupling or decoupling radio frequency energy between the input terminal and the output terminal selectively in accordance with a control signal comprising:
   (a) a radio frequency transmission line having a predetermined characteristic impedance, a first end adapted for electrical connection to a source of such radio frequency energy, and a second end electrically connected to the input terminal to feed radio frequency energy to the input terminal;
   (b) a plurality of field effect transistor cells, each one of such cells having a reactive element and source, drain and gate electrodes, the gate electrode of each one of the cells being electrically connected together at a first common conductor, the first common conductor being fed by the control signal, a first like one of the source and drain electrodes of the cells being electrically connected together at a second common conductor; and
   (c) a coupling means, having a first end connected to the input terminal and the second end of the radio frequency transmission line, and having a second end connected to the output terminal, for electrically cascade interconnecting the plurality of field effect transistor cells between the input terminal and the output terminal with a second one of such source and drain electrodes of one of the cells being electrically connected to a like one of the source and drain electrodes of another one of the cells, such coupling means having an impedance in accordance with the reactance of the reactive elements of the cells to provide such radio frequency network with a predetermined characteristic impedance matched to the impedance of the radio frequency transmission line when radio frequency energy is coupled.

15. The radio frequency network recited in claim 14 wherein the coupling means and the reactive elements provide series and shunt elements, respectively, of an artificial line.

16. The radio frequency network recited in claim 14 wherein said transmission line is a first transmission line, and wherein the coupling means includes a second radio frequency transmission line having a characteristic impedance in accordance with the impedance of the reactive elements to provide the radio frequency network with the predetermined characteristic impedance.

17. A radio frequency network comprising:
   (a) a substrate means having an active region;
   (b) a plurality of transistor cells in the active region of the substrate means, each one of such cells having a reactive element, an input electrode and an output electrode; and
   (c) a first radio frequency transmission line disposed over the substrate means for electrically interconnecting the plurality of transistor cells, with a first one of such input and output electrodes of the cells being electrically interconnected to a like one of such input and output electrodes of another one of the cells, such transmission line having a distributed reactance per unit length selected in accordance with the reactance of the reactive element of the cells to provide the radio frequency network with a predetermined characteristic impedance.

18. The radio frequency network as recited in claim 17 with said network having a predetermined input impedance and a predetermined output impedance, wherein each of the transistor cells has a second reactive element, wherein the first radio frequency transmission line interconnects the input electrodes of such transistor cells and has a first end connected to an input terminal of such network, and wherein the predetermined characteristic impedance of the network is related to the predetermined input impedance of the network; and including additionally;
   a second radio frequency transmission line disposed over the substrate means for electrically cascade interconnecting the plurality of transistor cells with such output electrodes of the cells being electrically interconnected to an output electrode of another one of the cells, such transmission line having a first end connected to an output terminal and having a distributed reactance per unit length selected in accordance with the reactance of the second reactive elements of the cells to provide the radio frequency network with a predetermined characteristic impedance related to the predetermined output impedance of the network.

19. The radio frequency network as recited in claim 18 wherein the transistor cells are field effect transistors, the input electrode is a gate electrode, and the output electrode is a first one of a drain and source electrode of the field effect transistor.

20. A distributed amplifier comprising:
   (a) a plurality of transistor cells with each one of such cells having a pair of reactive elements, and input, output and common electrodes;
   (b) an input radio frequency transmission line connected to an input terminal, such input transmission line having a distributed reactance per unit length for cascade interconnecting the plurality of cells, with the input electrodes of such cells being electrically interconnected by the transmission line and with the input electrode of a last cell connected to the input terminal through the input transmission line, such transmission line having the distributed reactance in accordance with the reactance of a first one of the reactive elements of the cells to provide the distributed amplifier with a predetermined input impedance;
   (c) an output radio frequency transmission line connected to an output terminal having a distributed reactance per unit length for cascade interconnecting the plurality of cells, with the output electrode of such cells being electrically interconnected by the output transmission line to an output electrode of another one of the cells, and with the output electrode of a first cell connected to the output terminal through the output transmission line, such transmission line having the distributed reactance in accordance with the reactance of a second one of the reactive elements of the cells to provide the distributed amplifier with a predetermined output impedance; and
   (d) wherein electrical pathlengths between the input terminal and the output terminal through each one of the transistor cells are equal.

21. The radio frequency network as recited in claim 20 wherein the transistor cells are field effect transistors, the input electrode is a gate electrode, and the output electrode is a first one of a drain and source electrode of the field effect transistor.

22. A distributed amplifier as recited in claim 20 wherein the common electrode of each transistor cell is coupled to a reference potential through a common r.f. and bias signal path.

* * * * *

Disclaimer 4,456,888.—*Yalcin Ayasli*, Lexington, Mass. RADIO FREQUENCY NETWORK HAVING PLURAL ELECTRICALLY INTERCONNECTED FIELD EFFECT TRANSISTOR CELLS. Patent dated June 26, 1984. Disclaimer filed Dec. 7, 1984, by the assignee, *Raytheon Co.*

Hereby enters this disclaimer to claims 17–22 of said patent.
[*Official Gazette July 30, 1985.*]